(12) United States Patent
Inagaki

(10) Patent No.: US 7,719,833 B2
(45) Date of Patent: May 18, 2010

(54) ELECTRONIC CONTROL DEVICE

(75) Inventor: Tatsuya Inagaki, Kariya (JP)

(73) Assignee: JTEKT Corporation, Osaka-shi (JP)

( * ) Notice: Subject to any disclaimer, the term of this patent is extended or adjusted under 35 U.S.C. 154(b) by 0 days.

(21) Appl. No.: 11/674,338

(22) Filed: Feb. 13, 2007

(65) Prior Publication Data
US 2007/0230137 A1 Oct. 4, 2007

(30) Foreign Application Priority Data
Mar. 31, 2006 (JP) ............... 2006-098609

(51) Int. Cl.
*H05K 7/20* (2006.01)
(52) U.S. Cl. .............. 361/688; 361/690; 361/704; 361/714; 361/715; 174/16.1; 174/16.3; 165/80.3
(58) Field of Classification Search .............. None
See application file for complete search history.

(56) References Cited

U.S. PATENT DOCUMENTS

| | | | | |
|---|---|---|---|---|
| 4,414,604 | A * | 11/1983 | Matsui et al. ............... | 361/698 |
| 5,065,278 | A * | 11/1991 | Schultz ....................... | 361/688 |
| 5,548,481 | A | 8/1996 | Salisbury et al. | |
| 5,828,551 | A * | 10/1998 | Hoshino et al. ............. | 361/697 |
| 6,088,225 | A * | 7/2000 | Parry et al. .................. | 361/704 |
| 6,369,320 | B1 * | 4/2002 | Okamoto ..................... | 174/50 |
| 6,434,000 | B1 * | 8/2002 | Pandolfi ...................... | 361/685 |
| 6,522,528 | B2 * | 2/2003 | Yamane ...................... | 361/601 |
| 6,547,001 | B2 * | 4/2003 | McCullough et al. ....... | 165/185 |
| 6,724,627 | B2 * | 4/2004 | Onizuka et al. ............. | 361/704 |
| 6,906,483 | B2 * | 6/2005 | Tominaga et al. ........... | 318/293 |
| 6,911,598 | B2 * | 6/2005 | Onizuka et al. ............... | 174/50 |
| 6,982,379 | B2 * | 1/2006 | Saka et al. .................... | 174/50 |
| 7,099,155 | B2 * | 8/2006 | Kobayashi et al. .......... | 361/719 |
| 7,156,677 | B2 * | 1/2007 | Yamane ...................... | 439/206 |
| 7,189,082 | B2 * | 3/2007 | Fukushima et al. ........ | 439/76.2 |
| 7,307,841 | B2 * | 12/2007 | Berlin et al. ................. | 361/699 |
| 2004/0141292 | A1 * | 7/2004 | Onizuka et al. ............. | 361/704 |
| 2005/0190539 | A1 | 9/2005 | Watanabe et al. | |

FOREIGN PATENT DOCUMENTS

| | | |
|---|---|---|
| EP | 1 509 074 A2 | 2/2005 |
| GB | 94 03 685 | 5/1994 |
| JP | 2005-150633 | 6/2005 |

* cited by examiner

*Primary Examiner*—Boris L Chervinsky
(74) *Attorney, Agent, or Firm*—Oblon, Spivak, McClelland, Maier & Neustadt, L.L.P.

(57) ABSTRACT

An upper lid forming an upper portion of a casing is formed by a metal (an aluminum alloy or the like) having a high heat radiation performance. The upper lid serves as a heat sink (a heat radiation member) radiating heat generated from electronic components within the casing to an external portion. A plurality of flat plate-shaped heat radiation fins are provided in an upper surface of the heat sink. A groove forming each of the heat radiation fins is open in a side surface of the heat sink without forming a step.

7 Claims, 4 Drawing Sheets

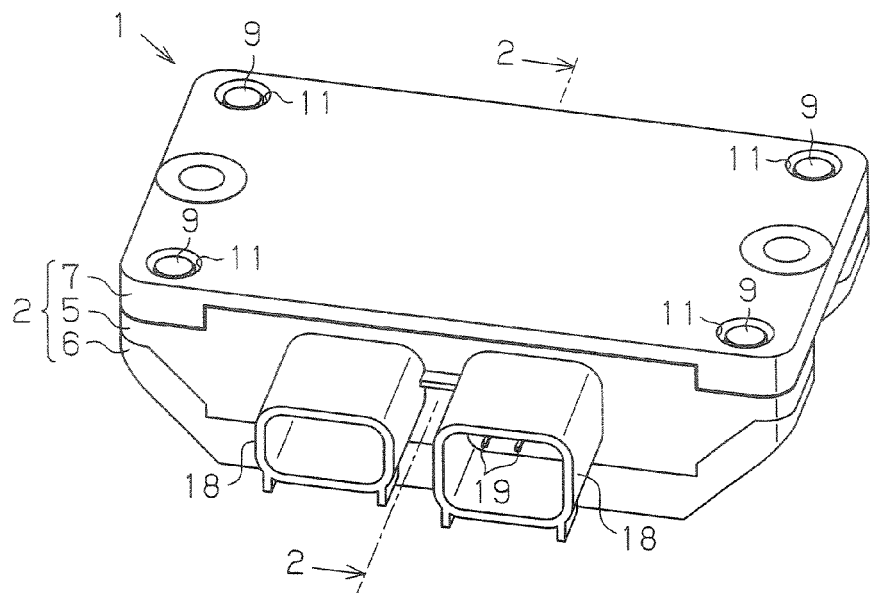
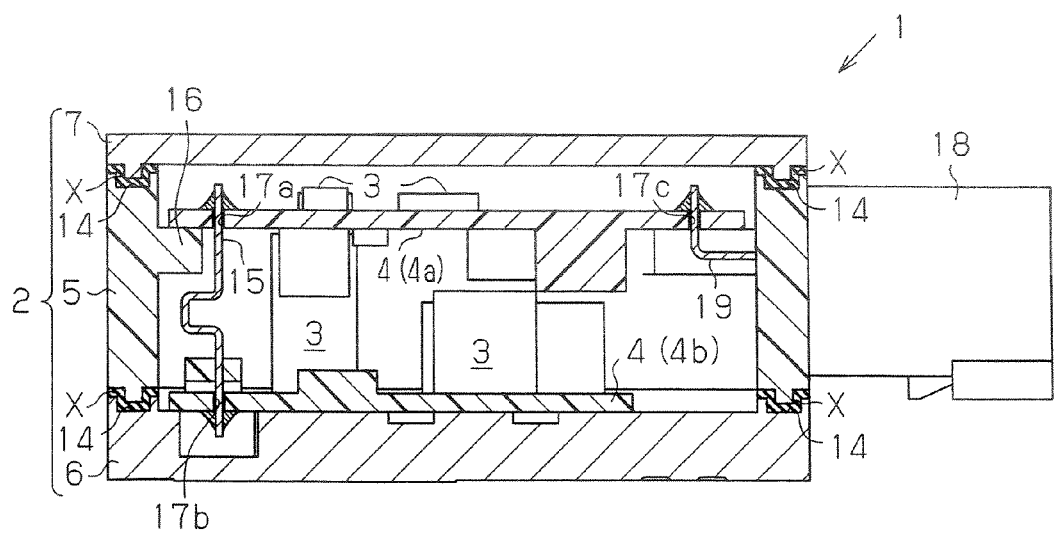

ELECTRONIC CONTROL DEVICE

BACKGROUND OF THE INVENTION

The present invention relates to an electronic control device.

For example, as disclosed in Japanese Laid-Open Patent Publication No. 2005-150633, an electronic control device for a vehicle is provided with a box-shaped casing, and an electronic circuit substrate on which electronic components are mounted is accommodated within the casing. Further, in most cases, an upper portion of the casing is provided with a heat sink for radiating heat generated from the electronic components to an external portion.

Normally, the heat sink is formed by a metal having a high heat radiation performance (high heat conductivity). As shown in FIG. 8, a plurality of heat radiation fins 41 are provided on an upper surface 40a of a heat sink 40 in order to increase a surface area. Accordingly, the heat radiation performance of the heat sink 40 is improved.

Conventionally, there has been required to effectively utilize a restricted space in a vehicle. Further, electronic control devices are required to add to flexibility in the arrangement. In other words, there are cases in which an electronic control device is covered with salt water or muddy water at a time of traveling, or the casing is mounted at a position which is completely submerged in water. Accordingly, various types of waterproofing are applied to the casing of electronic control devices.

However, since the heat sink is not used in a place which tends to get wet with water, no special waterproofing has been applied to heat sinks. Accordingly, in the case that a heat sink gets wet with muddy water or salt water, the heat radiation performance of the heat sink is lowered by corrosion or foreign material such as mud or the like.

SUMMARY OF THE INVENTION

An object of the present invention is to provide an electronic control device which can maintain an improved heat radiation performance even under an environment in which the device tends to get wet with water.

To achieve the foregoing and other objectives, one aspect of the present invention provides an electronic control device having an electronic circuit substrate. The electronic control device includes a casing, a metal heat sink, and grooves. The casing accommodates the electronic circuit substrate. The metal heat sink is provided in an upper portion of the casing and has a plurality of heat radiation fins. The grooves are formed in an upper portion of the casing. The grooves define the fins. Each of the grooves extends to a peripheral edge of the heat sink so as to open to a side surface of the heat sink without forming a step.

Other aspects and advantages of the invention will become apparent from the following description, taken in conjunction with the accompanying drawings, illustrating by way of example the principles of the invention.

BRIEF DESCRIPTION OF THE DRAWINGS

The invention, together with objects and advantages thereof, may best be understood by reference to the following description of the presently preferred embodiments together with the accompanying drawings in which:

FIG. 1 is a perspective view of an electronic control device;

FIG. 2 is a cross-sectional view taken along line 2-2 in FIG. 1;

DETAILED DESCRIPTION OF THE PREFERRED EMBODIMENTS

A description will be given of an embodiment according to the present invention with reference to the accompanying drawings.

Figure 3:
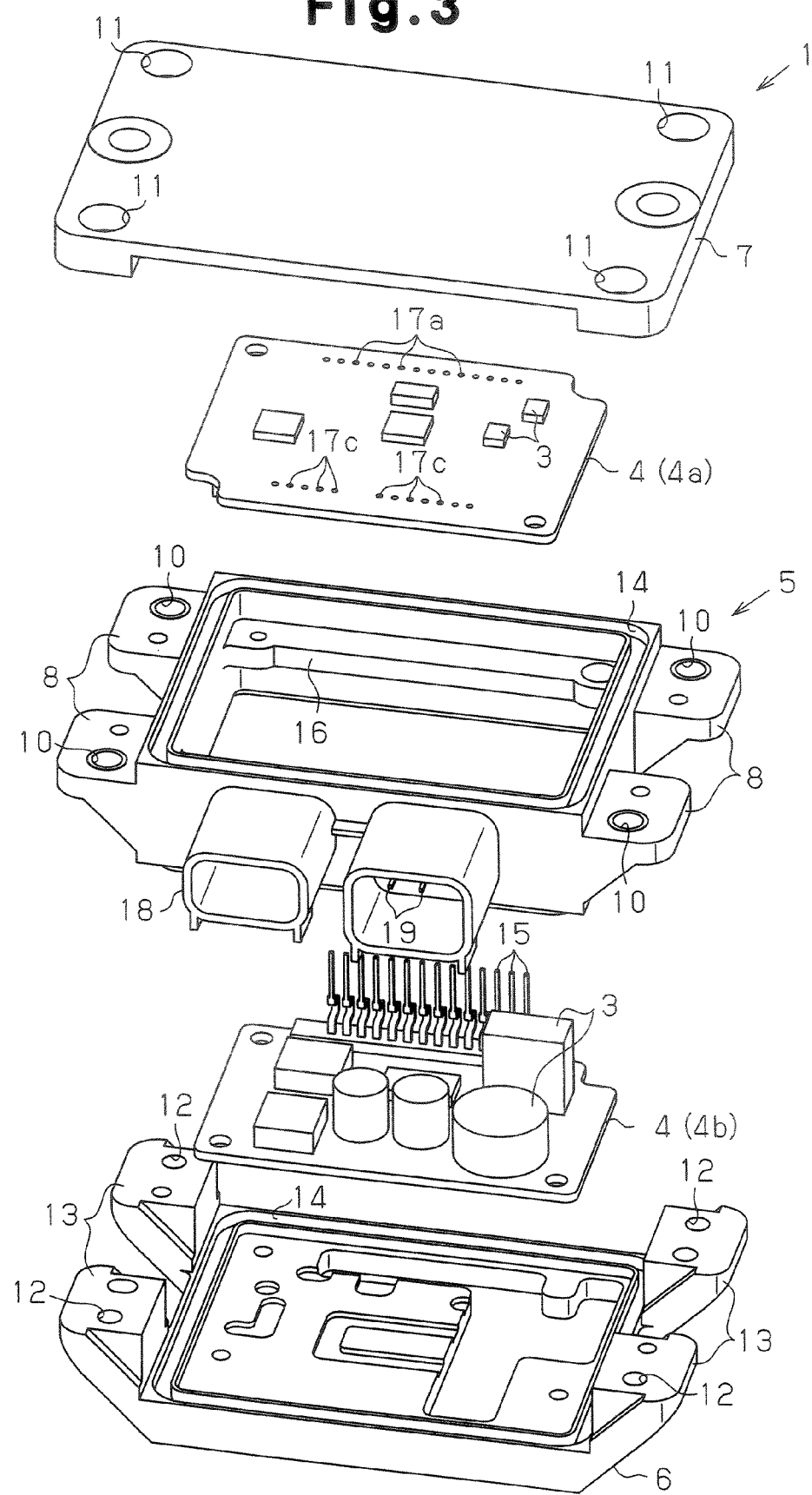
FIG. 3 is an exploded perspective view of the electronic control device.

As shown in FIGS. 1 to 3, an electronic control device 1 has a flat box-shaped casing 2. An electronic circuit substrate assembly 4 on which electronic components 3 are mounted is accommodated within the casing 2. The casing 2 is formed by a tubular casing main body 5, and substantially plate-shaped upper lid 6 and bottom lid 7 closing an opening of the casing main body 5. The upper lid 6 and the bottom lid 7 are fixed to flange portions 8 protruding laterally from outer side surfaces of the casing main body 5.

FIGS. 1 to 3 are shown in accordance with a layout in assembling steps, however, the layout at a time of being actually mounted to a vehicle is inverted to the layout in the assembling steps. Accordingly, in each of the drawings, the upper lid 6 directed upward at a time of being mounted to the vehicle is shown in a lower side, and the bottom lid 7 directed downward is shown in an upper side.

The casing main body 5 has four flange portions 8. Insertion holes 10 and 11 for inserting fastening screws 9 are formed in the flange portions 8 and positions corresponding to the respective flange portions 8 of the bottom lid 7, respectively. The upper lid 6 has four threaded holes 12. The respective threaded holes 12 are provided at positions corresponding to the respective insertion holes 10 and 11, in an inner side surface of the upper lid 6 to which the casing main body 5 is attached. In the upper lid 6, thick portions 13 are formed at positions (four positions) corresponding to the flange portions 8. Each of the threaded holes 12 is formed in the corresponding thick portion 13. The upper lid 6 and the bottom lid 7 are fastened to the casing main body 5 in such a manner as to hold the flange portions 8, by fastening the screws 9 inserted to the insertion holes 10 and 11 of the flange portions 8 and the bottom lid 7 to the threaded holes 12.

A seal groove 14 is formed in each of an open end of the casing main body 5 and an inner surface of the upper lid 6. Further, a joint portion between the casing main body 5 and the upper lid 6, and a joint portion between the casing main body 5 and the bottom lid 7 are sealed in a liquid tight manner by a sealing material X filling each of the seal grooves 14. In the present embodiment, a silicon adhesive agent is used as the sealing material X.

In the present embodiment, the electronic circuit substrate assembly 4 has a two-layer structure. The electronic circuit substrate assembly 4 is provided with two substrates 4a and 4b, and both the substrates 4a and 4b are electrically connected by a plurality of connection terminals 15. A plate-shaped support portion 16 is formed in an inner wall of the casing main body 5. The respective substrates 4a and 4b are fixed to the casing main body 5 via the support portion 16, thereby being arranged substantially in parallel to the upper lid 6 and the bottom lid 7. Further, both the substrates 4a and 4b can be electrically connected to each other via a plurality of connection terminals 15 by inserting and soldering both ends of each of the connection terminals 15 into component holes 17a and 17b of the respective substrates 4a and 4b. FIG. 3 shows a state in which one end of each connection terminal 15 is inserted to the corresponding component hole 17b of the substrate 4b.

Further, substantially tubular connector portions 18 are provided in an outer side surface of the casing main body 5 in such a manner as to protrude laterally. A wire harness (not shown) is coupled to each connector portion 18. A plurality of connector terminals 19 are provided within each connector portion 18. Each of the connector terminals 19 passes through a side wall of the casing main body 5. One end of each of the connector terminals 19 extending into the casing 2 is inserted and soldered to one of component holes 17c of the substrate 4a. Accordingly, each of the connector terminals 19 is electrically connected to the electronic circuit substrate assembly 4.

Figure 4:
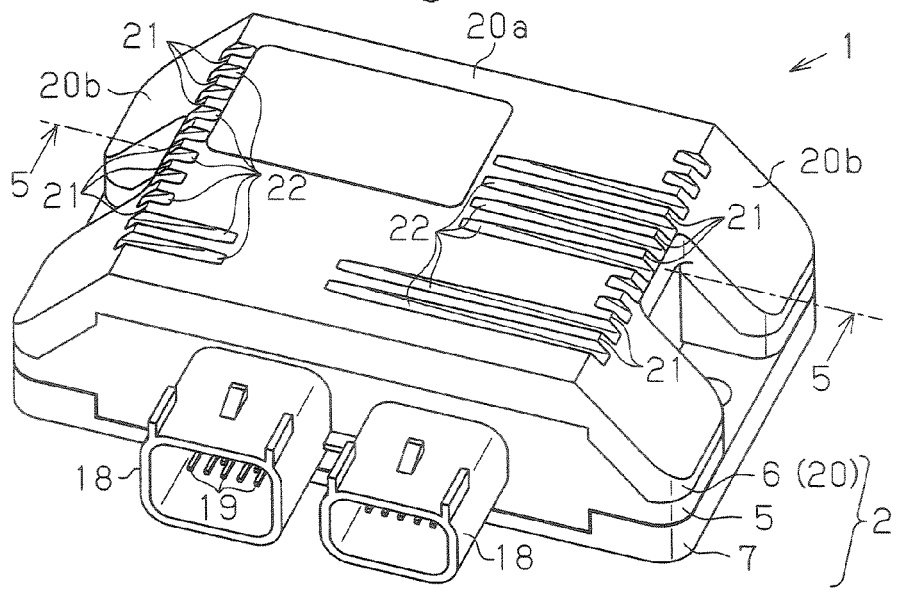
FIG. 4 is a perspective view of the electronic control device in a state of being mounted on a vehicle.

The upper lid 6 is formed by a metal (an aluminum alloy or the like) having a high heat radiation performance. In the case that the electronic control device 1 is mounted on the vehicle, the upper lid 6 is arranged in such a manner as to structure an upper portion of the casing 2 as shown in FIG. 4. On the basis of this layout, the upper lid 6 serves as a heat sink (a heat radiation member) 20 radiating heat generated from the electronic components 3 within the casing 2 to the external portion.

Figure 5:
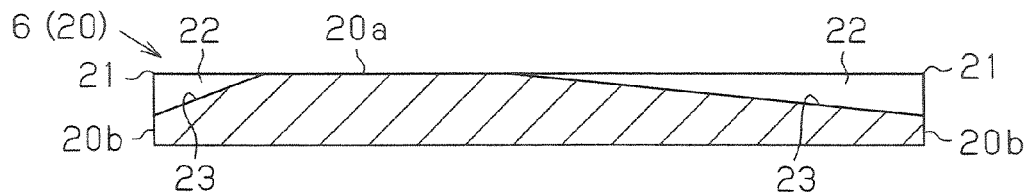
FIG. 5 is a cross-sectional view taken along line 5-5 in FIG. 4.

A plurality of heat radiation fins 21 formed in a flat plate shape are provided in an upper surface 20a of the heat sink 20. A number of grooves 22 are formed in the upper surface 20a of the heat sink 20 with a space between each adjacent pair. Each of the heat radiation fins 21 is a flat plate-shaped protrusion remaining between an adjacent pair of the grooves 22. In the present embodiment, all the grooves 22 forming each of the heat radiation fins 21 are open in a side surface 20b of the heat sink 20 without forming a step. Specifically, as shown in FIG. 5, the depth of each of the grooves 22 becomes larger gradually toward an outer peripheral edge from a center of the heat sink 20. A bottom surface 23 of each of the grooves 22 is formed by a slant surface which is sloped toward the outer peripheral edge from the center of the heat sink 20.

In accordance with the present embodiment, it is possible to obtain the following operations and advantages.

(1) The upper lid 6 forming the upper portion of the casing 2 at a time of being mounted on the vehicle is formed by the metal (an aluminum alloy or the like) having the high heat radiation performance. Accordingly, the upper lid 6 serves as the heat sink (the heat radiation member) 20. Further, a plurality of flat plate-shaped heat radiation fins 21 are provided on the upper surface 20a of the upper lid 6. The grooves 22 forming the heat radiation fins 21 are open to the side surface 20b of the heat sink 20 without forming steps.

In accordance with the structure mentioned above, even if the heat sink 20 gets wet or is submerged in water, the water does not stay within the grooves 22, but is discharged to the side surface 20b of the heat sink 20 from the end portions (the opening) of the grooves 22. Accordingly, it is possible to prevent corrosion due to the staying water and attachment of mud or the like, and it is possible to maintain the improved heat radiation performance.

(2) The bottom surface 23 of each of the grooves 22 is the slant surface which is sloped toward the outer peripheral edge from the center of the heat sink 20. Accordingly, it is possible to quickly discharge water from the groove 22.

(3) The threaded holes 12 are formed in the inner side surface of the upper lid 6 to which the casing main body 5 is attached. The upper lid 6 is fastened to the casing main body 5 by fastening the screws 9 inserted to the insertion holes 10 and 11 of the flange portions 8 and the bottom lid 7 to the threaded holes 12.

In accordance with the structure mentioned above, the fastening holes and the recesses are not formed in the upper surface 20a of the heat sink 20. Accordingly, it is possible to prevent the heat radiation performance from being lowered by the water staying in the holes or the recesses.

The present embodiment may be modified as follows.

In the illustrated embodiment, the heat sink 20 is formed in the upper lid 6 closing the opening of the casing main body 5. However, the structure may be made, for example, such that a heat sink corresponding to an independent part is attached to the upper portion of the casing.

In the illustrated embodiment, the heat radiation fins 21 are formed by setting a plurality of grooves 22 in the upper surface 20a of the heat sink 20. However, plate-shaped heat radiation fins may be provided on the upper surface 20a of the heat sink 20. In this case, the grooves are defined between the heat radiation fins.

Figure 6:
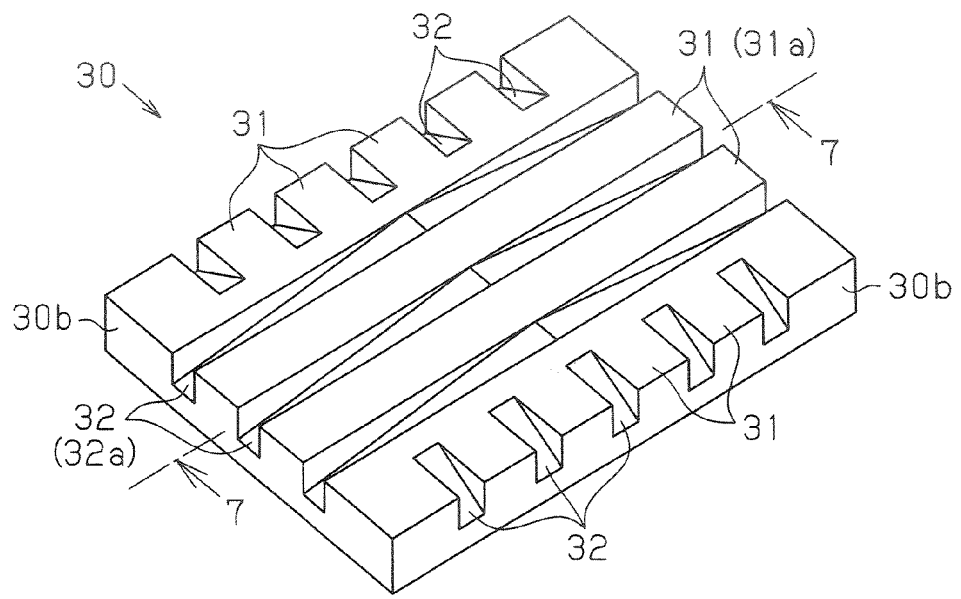
FIG. 6 is a perspective view of a heat sink in accordance with a modified embodiment.

In the illustrated embodiment, all the heat radiation fins 21 (22) are provided in parallel. However, such as a heat sink 30 shown in FIG. 6, heat radiation fins 31 (and grooves 32) may be provided in such a manner as to be orthogonal to all side surfaces 30b of the heat sink 30. Further, heat radiation fins (and the grooves) may be provided in a radial pattern from the center of the heat sink.

Figure 7:
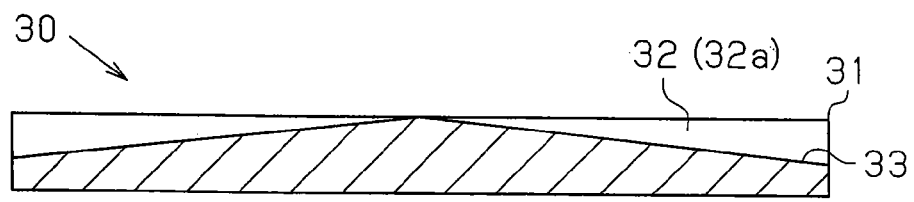
FIG. 7 is a cross-sectional view of the heat sink taken along line 7-7 in FIG. 6.
Figure 8:
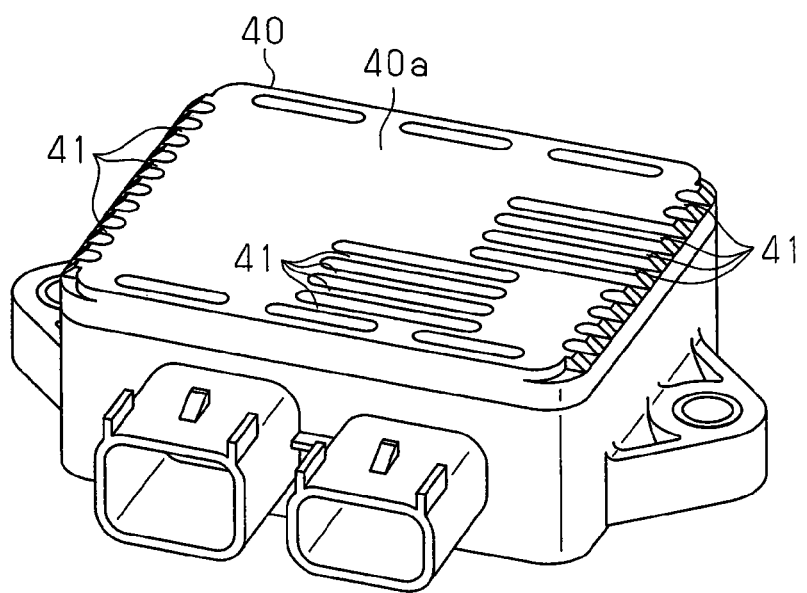
FIG. 8 is a perspective view of a prior art heat sink.

In the illustrated embodiment, the bottom surface 23 of each of the grooves 22 is the slant surface sloping in a specific direction. However, as in the heat sink 30 shown in FIGS. 6 and 7, grooves 32a may be formed in such a manner that both ends thereof are open to the side surface 30b of the heat sink 30, and a bottom surface 33 of each groove 32a is sloped toward both ends from the center of the groove 32a. In other words, it is possible to employ grooves 32a having an inverted V shaped cross section. In accordance with this structure, it is possible to further quickly discharge water from the grooves 32a. Also, it is possible to discharge water from the grooves 32a regardless of the sloping direction of the casing.

The invention claimed is:

1. An electronic control device having an electronic circuit substrate, the electronic control device comprising:

a casing accommodating said electronic circuit substrate; and a metal heat sink provided in an upper portion of said casing, wherein a top surface of said heat sink is provided with a plurality of grooves to define a plurality of heat radiation fins between the grooves;

wherein a bottom surface of each of said grooves is sloped downward toward a peripheral edge of the top surface of said heat sink from the center thereof, to discharge water from the groove, and wherein each of said grooves extends on said top surface from the center to the peripheral edge so as to open to a side surface of said heat sink without forming a step that can retain water in the groove.

2. The electronic control device according to claim 1, wherein a bottom surface of each of said grooves is sloped downward toward both ends of the top surface.

3. The electronic control device according to claim 2, wherein a vertical cross sectional shape of each of said grooves is formed in an inverted V.

4. The electronic control device according to claim 1, wherein said grooves are orthogonal to a side surface of said heat sink.

5. The electronic control device according to claim 1, wherein said casing is provided with an upper lid, a casing main body, and a bottom lid, said heat sink being formed by said upper lid, said casing main body being provided with an insertion hole for inserting a screw, wherein a threaded hole is provided at a position corresponding to said insertion hole on an inner side surface of said upper lid, and wherein said heat sink is fixed to said casing main body by fastening the screw inserted into the insertion hole of said casing main body to the threaded hole of said upper lid.

6. The electronic control device according to claim 5, wherein a joint portion between said casing main body and said upper lid, and a joint portion between said casing main body and said bottom lid are sealed in a liquid tight manner by a sealing material.

7. The electronic control device according to claim 6, wherein said sealing material is formed by a silicone adhesive agent.

* * * * *